United States Patent
Huang et al.

(10) Patent No.: US 12,434,315 B2
(45) Date of Patent: Oct. 7, 2025

(54) REVERSE SOLDERING CONNECTION STRUCTURE OF MICRONEEDLE AND WIRING AND PREPARATION PROCESS THEREFOR

(71) Applicant: WUHAN NEURACOM TECHNOLOGY DEVELOPMENT CO., LTD., Wuhan (CN)

(72) Inventors: Li Huang, Wuhan (CN); Cheng Huang, Wuhan (CN); Guangyan Cai, Wuhan (CN); Jianfei Gao, Wuhan (CN); Chunshui Wang, Wuhan (CN); Chao Wang, Wuhan (CN)

(73) Assignee: WUHAN NEURACOM TECHNOLOGY DEVELOPMENT CO., LTD., Wuhan (CN)

( * ) Notice: Subject to any disclaimer, the term of this patent is extended or adjusted under 35 U.S.C. 154(b) by 0 days.

(21) Appl. No.: 18/955,060

(22) Filed: Nov. 21, 2024

(65) Prior Publication Data
US 2025/0083243 A1    Mar. 13, 2025

Related U.S. Application Data
(63) Continuation of application No. PCT/CN2022/126569, filed on Oct. 21, 2022.

(30) Foreign Application Priority Data
Jul. 25, 2022 (CN) .......................... 202210878799.9

(51) Int. Cl.
*B23K 1/00*    (2006.01)
*B23K 1/20*    (2006.01)
*B23K 101/36*  (2006.01)

(52) U.S. Cl.
CPC .............. *B23K 1/0016* (2013.01); *B23K 1/20* (2013.01); *B23K 2101/36* (2018.08)

(58) Field of Classification Search
CPC ................. H01L 24/81; H01L 2224/11; H01L 2224/0401; H01L 2224/271;
(Continued)

(56) References Cited

U.S. PATENT DOCUMENTS 5,464,662 A * 11/1995 Murakami ............. H05K 1/111
                                                      427/595
6,432,748 B1 * 8/2002 Hsu ..................... H05K 3/4647
                                                      361/764
(Continued)

FOREIGN PATENT DOCUMENTS

CN    101030548 A    9/2007
CN    101543406 A    9/2009
(Continued)

OTHER PUBLICATIONS

First Office Action issued in counterpart Chinese Patent Application No. 202210878799.9, dated Dec. 23, 2023.
(Continued)

*Primary Examiner* — Erin B Saad
(74) *Attorney, Agent, or Firm* — Westbridge IP LLC (57) ABSTRACT

Disclosed are a reverse soldering connection structure of a microneedle and a wiring and a preparation process thereof. The reverse soldering metal layer of the microneedle is prepared; the reverse soldering metal layer of the wiring is prepared; the reverse soldering metal layer of the microneedle is aligned with the reverse soldering metal layer of the wiring, and they will be pressed to achieve reverse soldering connection between the microneedle and the wiring.

6 Claims, 7 Drawing Sheets

(58) Field of Classification Search
CPC . H01L 2224/27436; H01L 2224/27618; H01L 2224/29011; H01L 2224/48227; H01L 2224/48247; H05K 1/111; H05K 2203/0353; H05K 3/061; B23K 1/0016; B23K 35/025

See application file for complete search history.

(56) References Cited

U.S. PATENT DOCUMENTS

| | | | | |
|---|---|---|---|---|
| 6,503,779 | B2* | 1/2003 | Miyazaki | H01L 24/11 |
| | | | | 257/E23.021 |
| 7,991,475 | B1* | 8/2011 | Tang | A61B 5/24 |
| | | | | 607/45 |
| 8,886,279 | B2* | 11/2014 | Tathireddy | A61N 1/0531 |
| | | | | 607/116 |
| 2007/0128845 | A1* | 6/2007 | Hsu | H01L 23/49811 |
| | | | | 257/E23.068 |
| 2007/0278673 | A1* | 12/2007 | Shih-Ping | H05K 3/225 |
| | | | | 257/737 |
| 2009/0099534 | A1* | 4/2009 | Lee | B29C 33/42 |
| | | | | 264/494 |
| 2009/0326441 | A1* | 12/2009 | Iliescu | A61M 37/0092 |
| | | | | 604/22 |
| 2010/0006536 | A1 | 1/2010 | Kalvesten et al. | |
| 2017/0120396 | A1* | 5/2017 | Ohashi | B23K 35/3612 |
| 2017/0250162 | A1* | 8/2017 | Soga | H01L 24/27 |
| 2019/0355655 | A1* | 11/2019 | Yamaguchi | H01L 23/49816 |
| 2020/0295265 | A1* | 9/2020 | Moraes | C23C 14/5873 |
| 2021/0098341 | A1* | 4/2021 | Kong | A61B 5/262 |
| 2022/0223680 | A1* | 7/2022 | Oshima | H10D 62/40 |

FOREIGN PATENT DOCUMENTS

| | | |
|---|---|---|
| CN | 103985647 A | 8/2014 |
| CN | 109534284 A | 3/2019 |
| CN | 111053535 A | 4/2020 |
| CN | 111134654 A | 5/2020 |
| CN | 111613964 A | 9/2020 |
| CN | 112631425 A | 4/2021 |
| CN | 112701092 A | 4/2021 |
| CN | 113428832 A | 9/2021 |
| CN | 114284390 A | 4/2022 |
| CN | 114305433 A | 4/2022 |
| CN | 114343655 A | 4/2022 |
| CN | 114767122 A | 7/2022 |
| JP | 2006202849 A | 8/2006 |
| JP | 2008091692 A | 4/2008 |
| JP | 2013077689 A | 4/2013 |
| JP | 2014533523 A | 12/2014 |
| JP | 2018175789 A | 11/2018 |
| KR | 20020019782 A | 3/2002 |
| WO | 2020056925 A1 | 3/2020 |

OTHER PUBLICATIONS

International Search Report and Written Opinion issued in corresponding PCT Application No. PCT/CN2022/126569, dated Apr. 23, 2023.
Notification to Grant Patent Right for Invention issued in counterpart Chinese Patent Application No. 202210878799.9, dated Jun. 24, 2024.
Second Office Action issued in counterpart Chinese Patent Application No. 202210878799.9, dated Mar. 30, 2024.
Barz et al., CMOS-Compatible, Flexible, Intracortical Neural Probes, IEEE Transactions On Biomedical Engineering, vol. 67, No. 5, pp. 1366-1376, dated Aug. 21, 2019.
Extended European Search Report issued in counterpart European Patent Application No. 22952761.9, dated Aug. 19, 2025.
Kisban et al., A Novel Assembly Method for Silicon-Based Neural Devices, "World Congress on Medical Physics and Biomedical Engineering, Sep. 7-12, 2009, Munich, Germany", vol. 25/9, pp. 107-110, dated Jan. 1, 2009.
Notice of Reasons for Refusal issued in counterpart Japanese Patent Application No. JP 2024-570812, dated Jun. 3, 2025.
Xu, Post-CMOS and Post-MEMS Compatible Flexible Skin Technologies: A Review, IEEE Sensors Journal, vol. 13, No. 10, pp. 3962-3975, dated Oct. 1, 2013.

* cited by examiner

REVERSE SOLDERING CONNECTION STRUCTURE OF MICRONEEDLE AND WIRING AND PREPARATION PROCESS THEREFOR

CROSS-REFERENCE TO RELATED APPLICATIONS

This application is a continuation application of International Application No. PCT/CN2022/126569, filed on Oct. 21, 2022, which claims priority to Chinese Patent Application No. 202210878799.9, filed on Jul. 25, 2022, the entire contents of which are incorporated herein by reference.

TECHNICAL FIELD

The present application relates to the technical field of microneedles, and in particular to a reverse soldering connection structure of a microneedle and a wiring, and a preparation process thereof.

BACKGROUND

As we all know, humans think much faster than they communicate in writing or verbally. For example, when we use a keyboard to input text, many people will realize that their typing speed is far slower than their thinking speed. Moreover, for people with physical diseases such as severe paralysis or imperfect limbs, the bottleneck of this information transmission is more obvious.

Therefore, humans have been seeking to connect human nerves with external devices, so as to effectively increase the speed of information transmission. Neural interfaces were thus born. Neural interfaces, also commonly referred to as neural implants or neural "bonds", can establish connections between nerve cells and external devices. For example, Willett et al. published a paper in Nature (Willett, F. R., Avansino, D. T., Hochberg, L. R., Henderson, J. M. & Shenoy, K. V. Nature 593, 249-254 (2021)), which reports the development of a brain-computer interface (BCI) for typing. Such an interface could eventually allow paralyzed people to communicate at the speed of their thinking. In addition, neural interfaces are widely used to study and treat various neurological diseases.

Microneedles are important components of neural interfaces. It is known that conventional microneedles are integrated by through-silicon via (TSV) process. For example, Chinese Application Publication CN114343655A discloses a microneedle that can form a surface array with multiple contact points, and discloses a method for preparing the above-mentioned microneedle. The preparation process adopts the TSV process to form through holes at both ends of the tail of the microneedle body, and then the microneedle signal is led out through the threading process.

However, using the conventional TSV process to prepare microneedles has technical defects such as complex preparation process and high cost. Moreover, the stability of the connection between the microneedle and the wiring and the accuracy of signal transmission need to be improved.

SUMMARY

In view of this, the present application provides a reverse soldering connection structure of a microneedle and a wiring, and a preparation process thereof, which uses a reverse soldering connection method to solder the microneedle and the wiring together. Compared with the conventional TSV process for preparing microneedle arrays, the process steps are significantly simplified and accurate signal transmission can be achieved.

In order to achieve the above purpose, according to one aspect of the present application, the present application provides the following technical solutions.

A process for preparing a reverse soldering connection structure of a microneedle and a wiring, includes following steps.

S1, preparing a reverse soldering metal layer of the microneedle. A microneedle insulation layer is prepared on the microneedle, and the microneedle insulation layer is etched on the microneedle insulation layer corresponding to the microneedle signal output to form a first etching hole. Metal is electroplated in first the etching hole, and the microneedle insulation layer is released to expose the reverse solder metal layer of the microneedle.

S2, preparing a reverse soldering metal layer of the wiring. The wiring layout layer is prepared on the silicon wafer, and a wiring insulation layer is prepared on the wiring layout layer. The wiring insulation layer is etched on the wiring insulation layer corresponding to the signal input to form a second etching hole, and metal is electroplated in the second etching hole. The silicon of the reverse solder area corresponding to the back of the silicon wafer is etched, and the wiring insulation layer is released to expose the reverse solder metal layer of the wiring.

S3, aligning the reverse soldering metal layer of the microneedle with the reverse soldering metal layer of the wiring, and pressing the reverse soldering metal layer of the microneedle and the reverse soldering metal layer of the wiring to form a reverse soldering connection structure.

As a solution of the process for preparing a reverse soldering connection structure of a microneedle and a wiring according to the present application, the process uses the micro-electromechanical systems (MEMS) technology.

As a solution of the process for preparing a reverse soldering connection structure of a microneedle and a wiring according to the present application, in the step S1, the microneedle includes one single needle or multiple needles.

As a solution of the process for preparing a reverse soldering connection structure of a microneedle and a wiring according to the present application, in the step S1, the plurality of needles include 8 needles or 32 needles.

As a solution of the process for preparing a reverse soldering connection structure of a microneedle and a wiring according to the present application, in the step S1, the microneedle is an array microneedle.

As a solution of the process for preparing a reverse soldering connection structure of a microneedle and a wiring according to the present application, in the step S1, the array microneedle is 8×8 needles or 32×32 needles.

As a solution of the process for preparing a reverse soldering connection structure of a microneedle and a wiring according to the present application, in the step S1 or S2, the insulating layer is made of polyimide.

As a solution of the process for preparing a reverse soldering connection structure of a microneedle and a wiring according to the present application, in the step S1 or S2, the metal includes indium, copper, nickel or gold.

As a solution of the process for preparing a reverse soldering connection structure of a microneedle and a wiring according to the present application, in the step S2, the wiring is a single-row wiring or a multi-row wiring, and each wiring is provided with a reverse solder metal layer.

As a solution of the process for preparing a reverse soldering connection structure of a microneedle and a wiring according to the present application, in the step S3, pressing is performed at room temperature.

As a solution of the process for preparing a reverse soldering connection structure of a microneedle and a wiring according to the present application, in the step S3, the microneedle is modularly connected to the wiring.

As a solution of the process for preparing a reverse soldering connection structure of a microneedle and a wiring according to the present application, in the step S3, the reverse soldering connection structure is achieved by upper and lower metal reverse soldering, or by metal sidewalls reverse soldering.

According to one aspect of the present application, the present application also provides a reverse soldering connection structure of a microneedle and a wiring, which is prepared by the above-mentioned preparation process.

The beneficial effects of the present application are as follows.

The present application provides a reverse soldering connection structure of a microneedle and a wiring and a preparation process thereof. The reverse soldering metal layer of the microneedle is prepared; the reverse soldering metal layer of the wiring is prepared; the reverse soldering metal layer of the microneedle is aligned with the reverse soldering metal layer of the wiring, and they will be pressed to achieve reverse soldering connection between the microneedle and the wiring. Compared with the conventional TSV process for preparing microneedle arrays, the process steps are significantly simplified and accurate signal transmission can be achieved. The soldering stability of the microneedle and the wiring connected through the reverse soldering process of the present application is higher than that of the microneedle and wiring connected through the conventional TSV process, the service life is longer, and the failure rate is significantly reduced. The resistance value of the ohmic resistor generated by the electrical contact of the contact point is significantly reduced, which significantly improves the stability and accuracy of signal transmission.

BRIEF DESCRIPTION OF THE DRAWINGS

To more clearly illustrate technical solutions in the embodiments of the present application or the related art, the following will briefly introduce the drawings that need to be used in the description of the embodiments or the related art. Obviously, the drawings in the following description are only some embodiments of the present application. For those skilled in the art, without creative efforts, other drawings can be obtained according to these drawings.

The realization of the objective, functional characteristics, and advantages of the present application are further described with reference to the accompanying drawings.

DETAILED DESCRIPTION OF THE EMBODIMENTS

The following will be described clearly and completely in conjunction with the technical solutions in the embodiments. Obviously, the described embodiments are only part of the embodiments of the present application, not all of them. Based on the embodiments in the present application, all other embodiments obtained by those skilled in the art based on the embodiments of the present application without creative efforts shall fall within the claimed scope of the present application.

It should be noted that all the directional indications (such as up, down, left, right, front, rear . . . ) in the embodiments of the present application are only used to explain the relative positional relationship, movement, or the like of the components in a certain posture (as shown in the drawings). If the specific posture changes, the directional indication will change accordingly.

Besides, the descriptions associated with, e.g., "first" and "second," in the present application are merely for descriptive purposes, and cannot be understood as indicating or suggesting relative importance or impliedly indicating the number of the indicated technical feature. Therefore, the feature associated with "first" or "second" can expressly or impliedly include at least one such feature. Therefore, the features defined as "first" and "second" may explicitly or implicitly include at least one of the features. In addition, the technical solutions of the various embodiments can be combined with each other, but the combinations must be based on the realization of those skilled in the art. When the combination of technical solutions is contradictory or cannot be achieved, it should be considered that such a combination of technical solutions does not exist, nor does it fall within the scope of the present application.

The present application provides a reverse soldering connection structure of a microneedle and a wiring and a preparation process thereof, which has the following advantages.

Firstly, the present application uses the micro-electromechanical systems (MEMS) technology to prepare microneedles and wirings, especially when the microneedles are array microneedles, hundreds or even thousands of signal lines of the readout circuit can be led out by metal reverse soldering, improving the defects of multiple signal leads. In addition, the connection process used in the present application effectively reduces the process steps compared with the conventional process, improves production efficiency, and reduces production costs.

Secondly, in the present application, reverse soldering metal layers, especially metal indium layers, are prepared on microneedles and wiring respectively. The microneedle module is connected to the wiring module by pressing the microneedle module and the wiring module at room temperature, thereby reducing the ohmic resistor of electrical contact, stabilizing the soldering stability, and improving the signal output accuracy.

Thirdly, in the present application, during the process of realizing the connection between the wiring and the microneedle, especially when the microneedle is an array microneedle, the wiring can rotate and be inserted into the microneedle array, and the metal on the wiring is aligned with the metal on the microneedle array, and then they will be pressed at room temperature to form reverse soldering contact. Through the above operation, since the fixed metal segment of reverse soldering contact of the microneedle array intersects with the reverse soldering end of the wiring, the alignment accuracy of reverse soldering can be greatly improved, and the problem of reverse soldering alignment between the two modules is solved.

Lastly, in the present application, the wiring can not only be connected to the microneedle by upper and lower metal reverse soldering, but also can be connected to the microneedle by soldering metal sidewalls to complete the reverse soldering. Since the contact area during the process of soldering and connecting upper and lower metal reverse will be affected by the metal wiring, the metal sidewall reverse soldering connection can further increase the reverse soldering contact area on the one hand, and further improve the stability of the reverse soldering on the other hand.

The following specific embodiments are used to further illustrate the reverse soldering connection structure of a microneedle and a wiring and the preparation process of the present application.

The inventors found that the existing TSV process for preparing microneedles has the defects of complex preparation process, high cost, poor stability of connection between the microneedle and the wiring and poor accuracy of signal transmission. In view of this, in the embodiments of the present application provided by the inventors, the reverse soldering metal layer of the microneedle is prepared, the reverse soldering metal layer of the wiring is prepared, the reverse soldering metal layer of the microneedle is aligned with the reverse soldering metal layer of the wiring, and they will be pressed to achieve reverse soldering connection between the microneedle and the wiring. Compared with the conventional TSV process for preparing microneedle arrays, the process steps are significantly simplified and accurate signal transmission can be achieved. The soldering stability of the microneedle and the wiring connected through the reverse soldering process of the present application is higher than that of the microneedle and wiring connected through the conventional TSV process. The service life is longer, and the failure rate is significantly reduced. The resistance value of the ohmic resistor generated by the electrical contact of the contact point is significantly reduced, which significantly improves the stability and accuracy of signal transmission.

As shown in FIG. 1 to FIG. 5, in one embodiment of the present application, the process of realizing the reverse soldering connection between the microneedle and the wiring includes the following steps.

Figure 1:
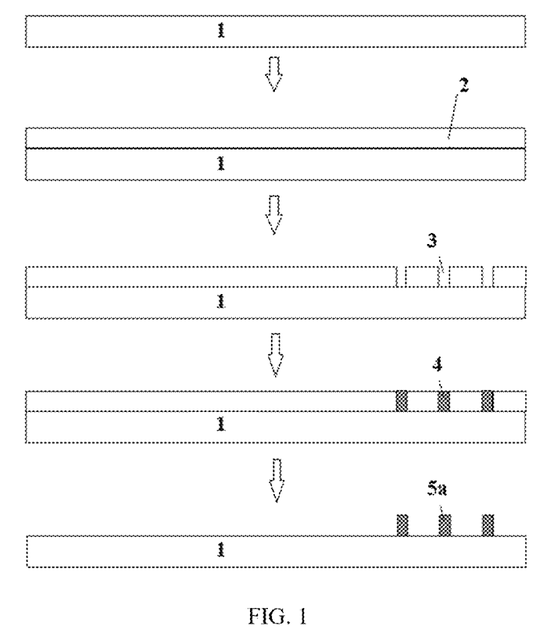
FIG. 1 is a schematic process flowchart of the microneedle reverse soldering contact metal of the present application.
Figure 2:
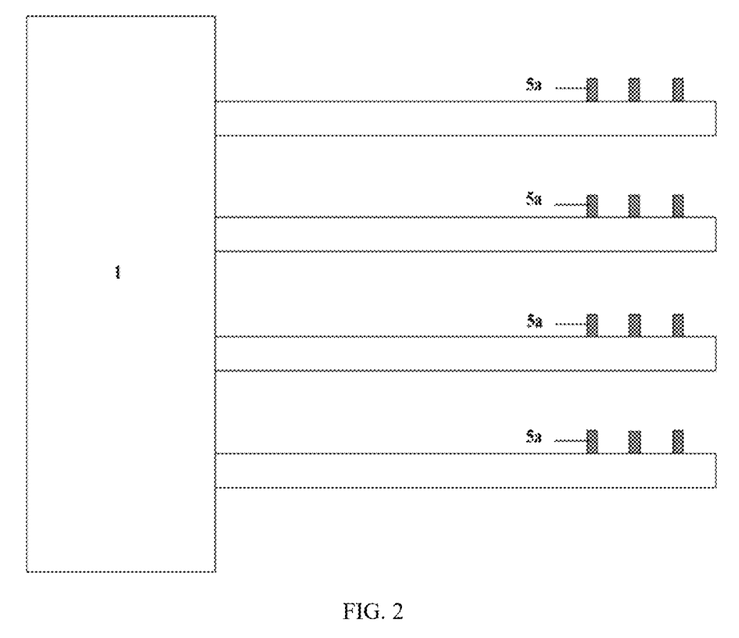
FIG. 2 is a schematic diagram of the top view of the microneedle reverse soldering contact array of the present application.

Step S1, preparing the microneedle 1 to be soldered, preparing a microneedle insulation layer 2 on the microneedle 1, the microneedle insulation layer 2 being preferably made of polyimide, etching the microneedle insulation layer at the designated position to form an etching hole 3, electroplating metal 4 in the etching hole 3, the electroplated metal 4 including indium, copper, nickel or gold, and the electroplated metal 4 being preferably indium; and releasing the microneedle insulation layer 2 to expose the reverse soldering contact metal 5a of the microneedle 1. The aforementioned designated position is a position above the microneedle signal output position corresponding to the microneedle insulation layer 2.

Figure 3:
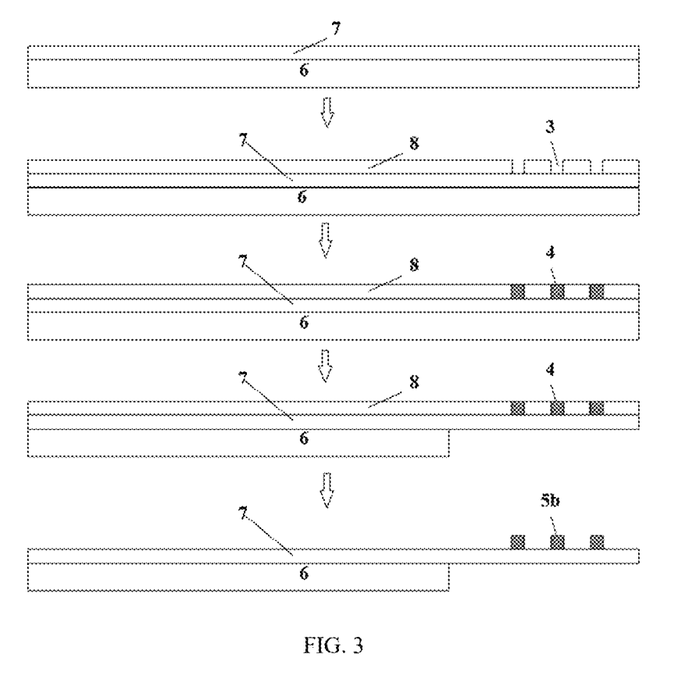
FIG. 3 is a schematic process flowchart of the wiring reverse soldering contact metal of the present application.
Figure 4:
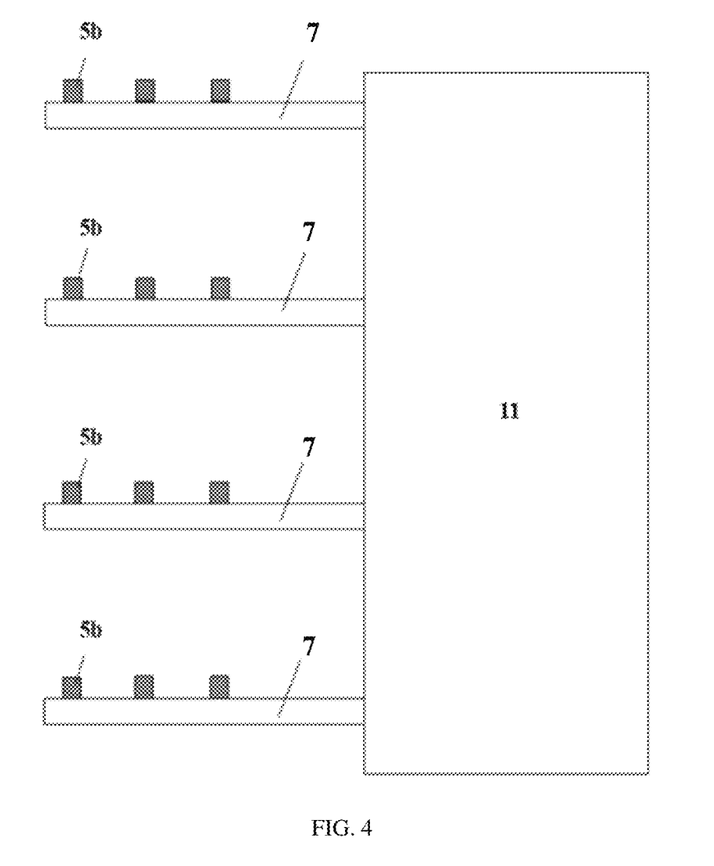
FIG. 4 is a schematic diagram of the top view of the wiring reverse soldering contact array of the present application.

Step S2, preparing a silicon wafer 6, preparing a wiring layout layer 7 on the silicon wafer 6, preparing a wiring insulation layer 8 on the wiring layout layer 7, the wiring insulation layer 8 being preferably made of polyimide, etching the wiring insulation layer 8 at the second designated position to form a second etching hole 3, electroplating metal 4 in the second etching hole 3, the electroplated metal 4 being preferably made of indium, etching the silicon at the reverse soldering area corresponding to the back of the silicon wafer 6, and releasing the wiring insulation layer 8 to expose the reverse soldering contact metal 5b of the wiring 11. The second designated position is a position above the signal input position corresponding to on the wiring insulation layer 8.

Figure 5:
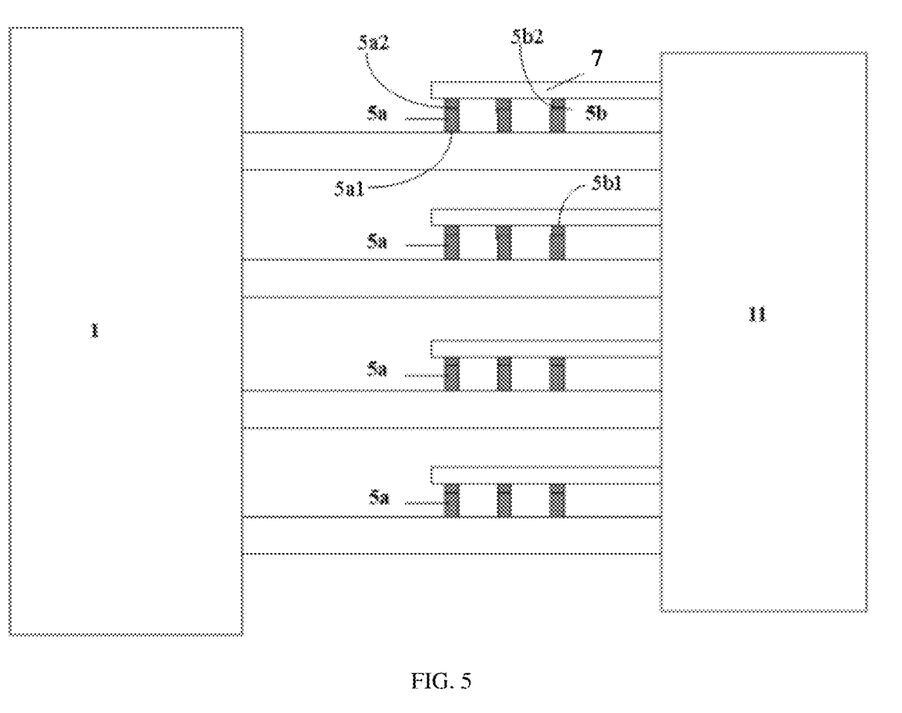
FIG. 5 is a schematic diagram of the microneedle array and the wiring array adopting a metal upper and lower reverse soldering connection method of the present application.

Step S3, finally, aligning the reverse soldering contact metal 5a of the microneedle 1 with the reverse soldering contact metal 5b provided at the wiring layout layer 7 of the wiring 11 up and down, and forming reverse soldering contact by pressing them at room temperature.

In an embodiment, as shown in FIG. 5, the reverse soldering contact metal 5a of the microneedle 1 is provided with a lower surface 5a1 close to the microneedle 1 and an upper surface 5a2 away from the microneedle 1. The reverse soldering contact metal 5b is provided at the wiring layout layer 7 of the wiring 11, and the reverse soldering contact metal 5b is provided with a lower surface 5b1 close to the wiring layout layer 7 of the wiring 11 and an upper surface 5b2 away from the wiring layout layer 7 of the wiring 11. By aligning the upper surface 5a2 of the reverse soldering contact metal 5a with the upper surface 5b2 of the reverse soldering contact metal 5b, reverse soldering contact is formed, thereby realizing the reverse soldering connection between the microneedle 1 and the wiring 11.

As shown in FIG. 1 to FIG. 4 and FIG. 6, in another embodiment of the present application, the process of realizing reverse soldering connection between the microneedle and the wiring includes the following steps.

Step S1, preparing the microneedle 1 to be soldered, preparing the microneedle insulation layer 2 on the microneedle 1, the microneedle insulation layer 2 being preferably made of polyimide, etching the microneedle insulation layer 2 corresponding to the microneedle signal output position to form the etching hole 3, electroplating metal 4 in the etching hole 3, the metal 4 being preferably made of indium, and releasing the microneedle insulation layer 2 to expose the reverse soldering contact metal 5a of the microneedle 1.

Step S2, preparing the silicon wafer 6, preparing the wiring layout layer 7 on the silicon wafer 6, preparing the wiring insulation layer 8 on the wiring layout layer 7, the wiring insulation layer 8 being preferably made of polyimide, etching the wiring insulation layer 8 corresponding to the signal input position to form the second etching hole 3, electroplating metal 4 in the second etching hole 3, the metal 4 being preferably made of indium, etching silicon at the reverse soldering area corresponding to the back of the silicon wafer 6, and releasing the wiring insulation layer 8 to expose the reverse soldering contact metal 5b of the wiring 11.

Figure 6:
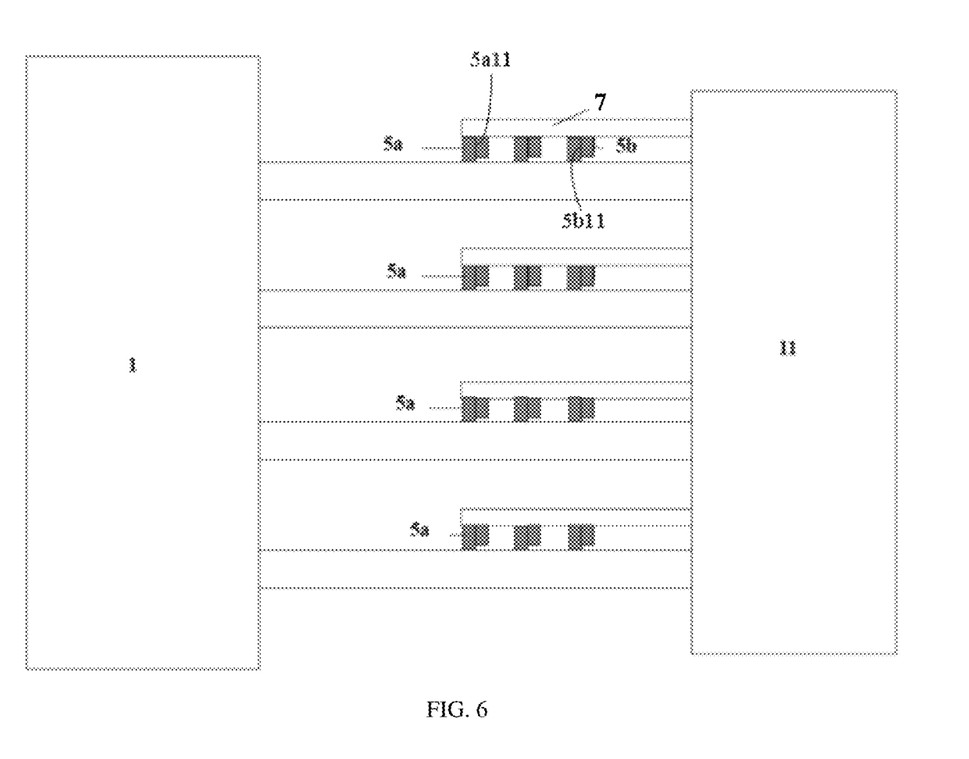
FIG. 6 is a schematic diagram of the microneedle array and the wiring array adopting a metal sidewall reverse soldering connection method of the present application.

Step S3, finally, connecting the metal sidewall 5a11 of the reverse soldering contact metal 5a of the microneedle 1 and the metal sidewall 5b11 of the reverse soldering contact metal 5b provided at the wiring layout layer 7 of the wiring 11 to each other, and forming reverse soldering contact by pressing them at room temperature.

In an embodiment, as shown in FIG. 6, the reverse soldering contact metal 5a of the microneedle 1 is provided with a sidewall 5a11 in contact with the reverse soldering contact metal 5b provided at the wiring layout layer 7 of the wiring 11, and the reverse soldering contact metal 5b provided at the wiring layout layer 7 of the wiring 11 is provided with a sidewall 5b11 in contact with the reverse soldering contact metal 5a of the microneedle 1. By connecting the sidewall 5a11 of the reverse soldering contact metal 5a with the sidewall 5b11 of the reverse soldering contact metal 5b, reverse soldering contact is formed, thereby realizing the microneedle 1 and the wiring 11.

By this method of reverse soldering and connecting the metal sidewall, the reverse soldering area can be increased, and the soldering stability of the microneedle and the wiring can be further improved.

Figure 7:
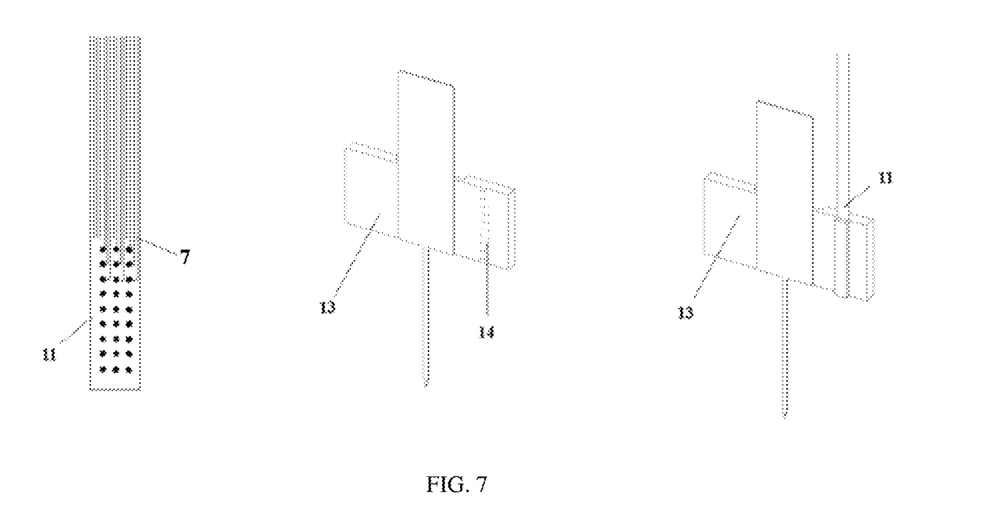
FIG. 7 is a schematic diagram of the single-needle soldering of the present application.

As shown in FIG. 7, in another embodiment of the present application, the microneedle is formed by a single needle or multiple needles, and each needle body is provided with a reverse soldering metal layer. For example, by preparing a microneedle reverse soldering contact 14 of a single-needle microneedle 13, preparing a reverse soldering metal layer of the wiring, aligning the microneedle reverse soldering contact 14 of the single-needle microneedle 13 with the reverse soldering metal layer of the wiring, or connecting the microneedle reverse soldering contact 14 of the single-needle microneedle 13 with the sidewall of the reverse soldering metal layer of the wiring, and pressing them to form a reverse soldering contact, the reverse soldering connection of the single-needle microneedle and the wiring is realized. The specific implementation steps can refer to the above-mentioned embodiments.

Figure 8:
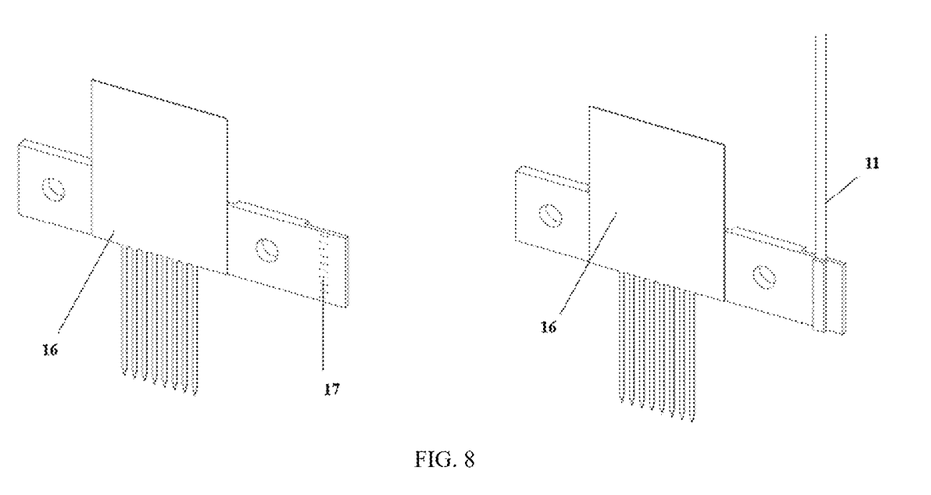
FIG. 8 is a schematic diagram of the 8-needle soldering of the present application.

As shown in FIG. 8, in another embodiment of the present application, by preparing microneedle reverse soldering contact 17 of 8 microneedles 16, preparing the reverse soldering metal layer of the wiring, aligning the microneedle reverse soldering contact 17 of 8 microneedles 16 with the reverse soldering metal layer of the wiring, or connecting microneedle reverse soldering contact 17 of 8 microneedles 16 with the sidewall of the reverse soldering metal layer of the wiring, and pressing them to form reverse soldering contact, the reverse soldering connection of 8 microneedles 16 and the wiring 11 is realized. The specific implementation steps can refer to the above-mentioned embodiments.

Figure 9:
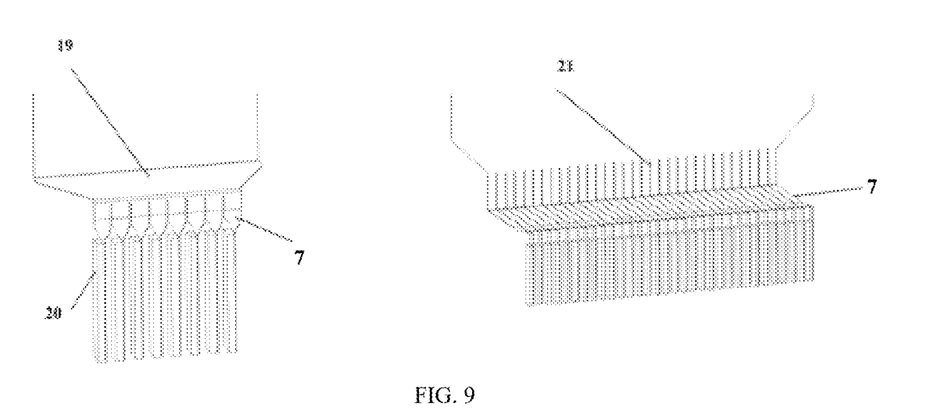
FIG. 9 is an enlarged schematic diagram of the wiring of the present application.
Figure 10:
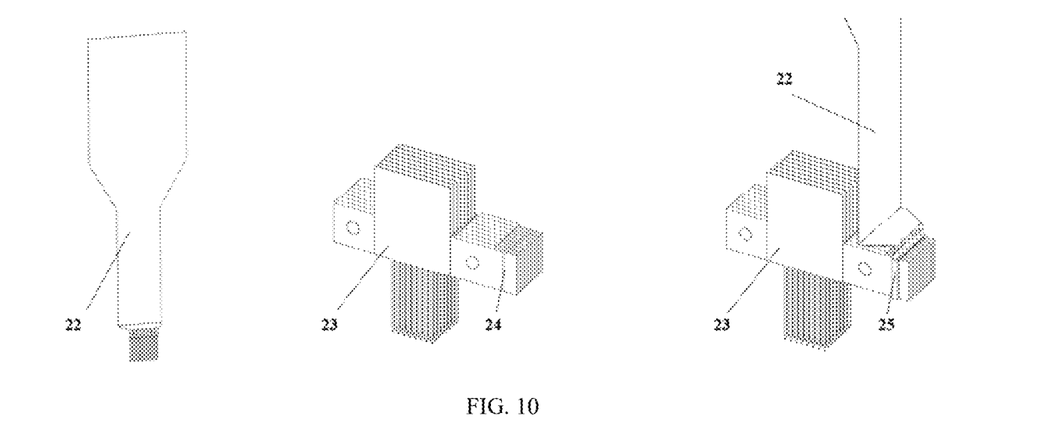
FIG. 10 is a schematic diagram of the 8×8 needle soldering of the present application.
Figure 12:
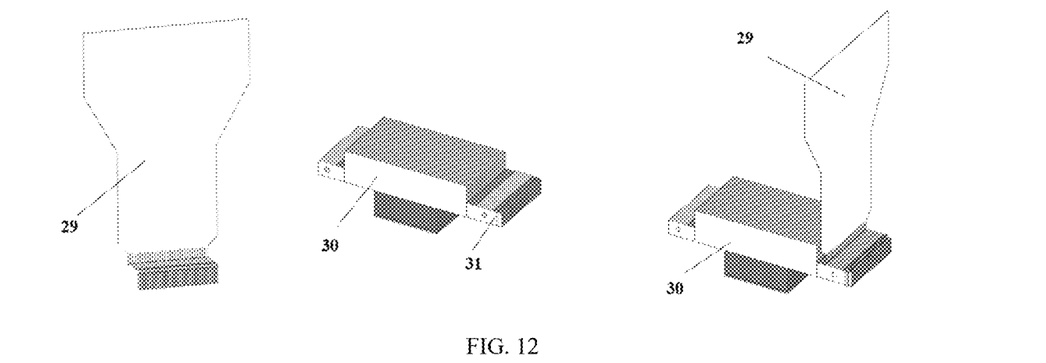
FIG. 12 is a schematic diagram of the 32×32 needle soldering of the present application.

As shown in FIG. 9, it is an enlarged schematic diagram of the wiring array corresponding to the 8×8 needle wiring 19 and the 32×32 needle wiring 21. When the microneedle is an array microneedle and the wiring is an array wiring, for example, when the 8×8 needle array microneedle 23 and the 8×8 needle wiring 22 are reverse soldered as shown in FIG. 10, or when the 32×32 needle array microneedle 30 and the 32× 32 needle wiring 29 are reverse soldered as shown in FIG. 12, the array wiring in the present application can rotate and be inserted into the microneedle array, and then the array wiring and the microneedle array are reverse soldered, thereby realizing modular rapid soldering of the microneedle array and the array wiring. Compared with the conventional TVS process of preparing the microneedle array and then leading out the microneedle signal through the wire bonding process, the efficiency of the entire process is significantly improved.

As shown in FIG. 10, in another embodiment of the present application, by preparing 8×8 array microneedle reverse soldering contact 24 of the 8×8 needle array microneedle 23, preparing the reverse soldering metal layer of the 8×8 needle wiring 22, the 8×8 array microneedle reverse soldering contact 24 of the 8×8 needle array microneedle 23 is aligned with the reverse soldering metal layer of the 8×8 needle wiring 22, or the 8×8 array microneedle reverse soldering contact 24 of the 8×8 needle array microneedle 23 and the sidewall of the reverse soldering metal layer of the 8×8 needle wiring 22 are connected to each other, and the reverse soldering connection 25 of the 8×8 needle array microneedle and the 8×8 needle wiring is realized by pressing them to form a reverse soldering contact. The specific implementation steps can refer to the above-mentioned implementation method.

Figure 11:
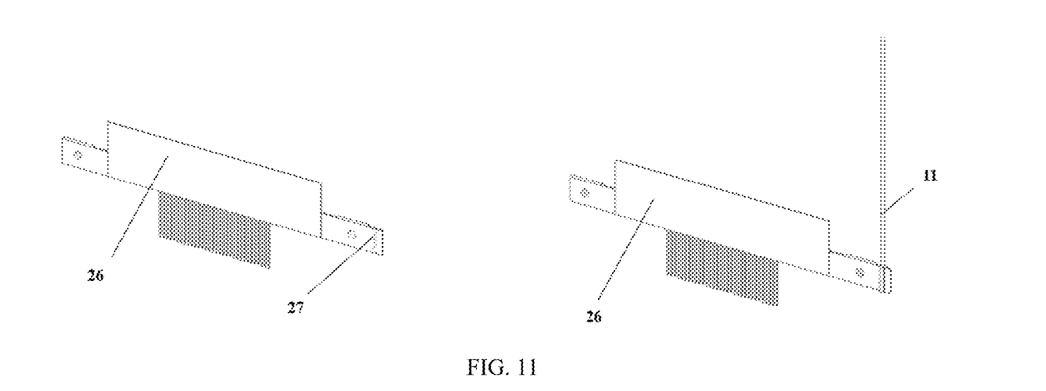
FIG. 11 is a schematic diagram of the 32-needle soldering of the present application.

As shown in FIG. 11, in another embodiment of the present application, preparing the reverse soldering connection 27 of 32 microneedles 26, preparing the reverse soldering metal layer of the wiring, aligning the microneedle reverse soldering contact 27 of 32 microneedles 26 with the reverse soldering metal layer of the wiring, or connecting the microneedle reverse soldering contact 27 of 32 microneedles 26 with the sidewall of the reverse soldering metal layer of the wiring, and pressing them to form reverse soldering contact. The specific implementation steps can refer to the above-mentioned embodiments.

As shown in FIG. 12, in another embodiment of the present application, by preparing the 32× 32 array microneedle reverse soldering contact 31 of 32× 32 array microneedle 30, preparing the reverse soldering metal layer of the 32×32 needle array wiring 29, aligning the 32×32 array microneedle reverse soldering contact 31 of the 32× 32 needle array microneedle 30 with the reverse soldering metal layer of the 32×32 needle wiring, or connecting the 32×32 array microneedle reverse soldering contact 31 of the 32×32 needle array microneedle 30 with the sidewall of the reverse soldering metal layer of the 32×32 needle wiring, and pressing them to form the reverse soldering contact, the reverse soldering connection between the 32× 32 needle array microneedle 30 and the 32×32 needle wiring 29 can be realized. The specific implementation steps can refer to the above-mentioned embodiments.

In another embodiment of the present application, a microneedle and a wiring connected by reverse soldering are provided, which are prepared by any of the above embodiments. The soldering stability between the microneedle and the wiring is higher than that of the microneedle and the wiring prepared by the conventional TSV process, so that the service life is longer and the failure rate is significantly reduced. Further, by contacting with electroplating indium metal, the resistance value of the ohmic resistor generated by the electrical contact of the contact point is significantly reduced, which significantly improves the stability and accuracy of signal transmission.

The above are only some embodiments of the present application, and do not limit the scope of the present application thereto. Under the concept of this application, any equivalent structural transformation made according to the description of the present application, or direct/indirect application in other related technical fields shall fall within the claimed scope of the present application.

What is claimed is:

1. A process for preparing a reverse soldering connection structure of a microneedle and a wiring, comprising following steps:

S1, preparing a reverse soldering metal layer of the microneedle;

S2, preparing a reverse soldering metal layer of the wiring; and

S3, aligning the reverse soldering metal layer of the microneedle with the reverse soldering metal layer of the wiring, and pressing the reverse soldering metal layer of the microneedle and the reverse soldering metal layer of the wiring to form a reverse soldering connection structure;

wherein the preparing the reverse soldering metal layer of the microneedle comprises:

preparing a microneedle insulation layer on the microneedle;

etching the microneedle insulation layer at a designated position to form an etching hole, and electroplating metal in the etching hole; and releasing the microneedle insulation layer to expose the reverse soldering metal layer of the microneedle, wherein the reverse soldering connection structure is formed by reversedly soldering an upper metal and a lower metal, or the reverse soldering connection structure is formed by reversedly soldering and connecting metal sidewalls.

2. The process for preparing the reverse soldering connection structure of the microneedle and the wiring according to claim 1, wherein the preparing the reverse soldering metal layer of the wiring comprises:

preparing a wiring layout layer on a silicon wafer, and preparing a wiring insulation layer on the wiring layout layer; and etching the wiring insulation layer at a second designated position to form a second etching hole, electroplating metal in the second etching hole, etching silicon at a reverse soldering area corresponding to a back of the silicon wafer, releasing the wiring insulation layer, and exposing the reverse soldering metal layer of the wiring.

3. The process for preparing the reverse soldering connection structure of the microneedle and the wiring according to claim 2, wherein both the microneedle insulation layer and the wiring insulation layer are made of polyimide.

4. The process for preparing the reverse soldering connection structure of the microneedle and the wiring according to claim 1, wherein the metal comprises indium, copper, nickel or gold.

5. The process for preparing the reverse soldering connection structure of the microneedle and the wiring according to claim 1, wherein the wiring is formed by a row of wirings or a plurality of rows of wirings, and each wiring is provided with the reverse soldering metal layer.

6. The process for preparing the reverse soldering connection structure of the microneedle and the wiring according to claim 1, wherein the microneedle is formed by a needle or a plurality of needles, and each needle body is provided with the reverse soldering metal layer.

* * * * *